United States Patent
Chen et al.

(10) Patent No.: US 7,608,851 B2
(45) Date of Patent: Oct. 27, 2009

(54) SWITCH ARRAY CIRCUIT AND SYSTEM USING PROGRAMMABLE VIA STRUCTURES WITH PHASE CHANGE MATERIALS

(75) Inventors: Kuan-Neng Chen, White Plains, NY (US); Chung H. Lam, Peekskill, NY (US)

(73) Assignee: International Business Machines Corporation, Armonk, NY (US)

( * ) Notice: Subject to any disclaimer, the term of this patent is extended or adjusted under 35 U.S.C. 154(b) by 66 days.

(21) Appl. No.: 11/745,811

(22) Filed: May 8, 2007

(65) Prior Publication Data
US 2008/0277644 A1  Nov. 13, 2008

(51) Int. Cl.
*H01L 29/02* (2006.01)
(52) U.S. Cl. .............. 257/5; 257/2; 257/3; 257/4; 257/E29.002; 438/102; 438/103; 365/163
(58) Field of Classification Search ........... 257/1–5; 438/102–103
See application file for complete search history.

(56) References Cited

U.S. PATENT DOCUMENTS 4,682,008 A * 7/1987 Masaka ............... 219/270
2004/0113137 A1   6/2004 Lowrey
2004/0160798 A1 * 8/2004 Rinerson et al. ........... 365/100
2006/0073652 A1 * 4/2006 Pellizzer et al. ........... 438/201
2006/0097240 A1   5/2006 Lowrey
2006/0097341 A1   5/2006 Pellizzer
2006/0157679 A1   7/2006 Scheuerlein

OTHER PUBLICATIONS

U.S. Appl. No. 11/733,523, filed Apr. 10, 2007, issued to Kuan-Neng Chen.

* cited by examiner

*Primary Examiner*—Thanh V Pham
*Assistant Examiner*—Jami M Valentine
(74) *Attorney, Agent, or Firm*—Scully, Scott, Murphy & Presser, P.C.; Vazken Alexanian

(57) ABSTRACT

A programmable via structure that includes at least two phase change material vias each directly contacting a heating element, the via structure further including a first terminal in contact with a first heating element portion, a second terminal in contact with a second heating element portion, a third terminal in contact with one of the vias, and a fourth terminal in contact with another one of the vias; a first circuit block in contact with one of the third and fourth terminals; a second circuit block in contact with the third or fourth terminal not contacting the first circuit block; a source region of a first transistor in contact with one of the first and second terminals; and a drain region of a second transistor in contact with the first or second terminal that is not contacting the source region of the first transistor.

17 Claims, 4 Drawing Sheets

US 7,608,851 B2

SWITCH ARRAY CIRCUIT AND SYSTEM USING PROGRAMMABLE VIA STRUCTURES WITH PHASE CHANGE MATERIALS

FIELD OF THE INVENTION

The present invention relates to a circuit and system design including at least one switch unit. More particularly, the present invention relates to the use of a switch array including programmable vias which contain phase change materials that are integrated with a heating element in a circuit and system design. The inventive circuit and system design provides a fast and reliable logic switching property medium as well as enabling the creation of two-dimensional switch functionality.

BACKGROUND OF THE INVENTION

Reconfigurable circuits have been widely used in the semiconductor industry for field programmable gate arrays (FPGAs) and for repair of a defective memory element. The FPGA consists of a set of simple, configurable logic blocks in an array with interspersed switches that can rearrange the interconnection between the logic blocks.

Reconfigurable circuits are also expected to play a significant role in three-dimensional (3D) integration technology that is presently being developed. Three-dimensional integration fabricates multilayer structures which are vertically stacked one upon another that can form a single chip combination with different functionalities. In these multilayered and multifunctional structures, reconfigurable circuit connection is typically needed to provide controllable logic functionality, memory repair, data encryption as well as other functions.

The programmable via is an enabling technology for high-performance reconfigurable logic applications without the trade offs in low logic gate density and power. Phase change materials are an attractive option for this application, but to date, have drawn the most attention from semiconductor memory developers as a possible replacement for flash memory.

Phase change materials are typically ternary alloys of germanium (Ge), antimony (Sb) and tellurium (Te), with a typical composition being $Ge_2Sb_2Te_5$. Other compositions such as GeSb and $GeSb_4$ (including substitution/addition of other elements, i.e., dopants) are under active investigation.

At room temperature, and up to moderately elevated temperatures, phase change materials are stable in two phases, a crystalline phase, which is a moderately good conductor of electricity, and an amorphous phase, which is insulating. The phases are interconverted by thermal cycling. The thermal cycling consists of (i) the "RESET" (or OFF) pulse, which is the conversion of the phase change material from a crystalline phase to an amorphous phase. In this thermal cycle, the temperature is raised above the melting point of the phase change material, followed by a rapid quench in a time $t_1$ as a result of which the disordered arrangement of atoms in the melt is retained. (ii) The "SET" (or ON) pulse, in which an anneal at a lower temperature is performed for a somewhat longer time $t_2$ which enables the conversion from the amorphous phase back into the crystalline phase.

The programmable via is comprised of a phase change material (PCM), which can be switched between resistive (OFF-amorphous) and conductive (ON-crystalline) states with an integrated heating element. The switching process is typically accomplished by a current pulse passed through the heating element which bisects the via containing the phase change material. The OFF switching operation is accomplished by an abrupt high-current pulse to melt and quench/amorphize a thin region of the phase change via adjacent to the heating element. In the ON switching operation, a relatively low current, but longer, pulse is applied through the heating element to anneal the amorphous PCM to the crystalline state.

In the prior art, only the top half of the via (plus the heating element) is implemented and introduced, where the via resistance has been measured between the top contact of the via and one of the heating element contacts.

Although the concept of programmable via structures and their fabrication have been purposed, there has been no disclosure of a circuit design or system design which describes the use and incorporation of such devices to achieve better performance of PCM switching.

SUMMARY OF THE INVENTION

The present invention provides the use of a switch unit as well as an array with switch units. Each switch unit within the array is connected to control/switch certain circuit blocks. Each switch unit structure of the present invention comprises a four terminal programmable via structure that contains one heating element and at least two vias filled with phase change materials that are in contact with the heating element. In a preferable embodiment, two phase change material vias are present and they are located on two opposite sides (i.e., opposing surfaces) of the heating element The two vias filled with phase change materials are connected to metal levels (e.g., $M_{n+1}$ and $M_n$), then further connected to certain circuit blocks.

The heating element is typically configured to switch the conductivity of a transformable portion of the PCM material between a lower resistance crystalline state and a higher resistance amorphous state. The heating element is connected to control units (such as field effect transistors (FETs)) from two portions, particular end portions, of the heating element. The present invention provides a reconfigurable switch function by controlling the current (i.e., heat) passing through the heating element, further affecting the resistive states of the via structures, and finally switching ON/OFF of the circuit block due to the resistance load of the vias.

Each heating element present in the inventive design is connected to two transistors from its two end terminals through the $M_n$ level. The source electrode of one of the two transistors is grounded, while its drain electrode is connected to one end of the heating element and its gate electrode is connected to a write line.

With respect to the other transistor, the drain electrode of the other transistor is connected to a bit line, while the gate electrode of this other transistor is connected to a write line and its source is connected to the other end of the heating element.

In one embodiment of the present invention, a single switch unit is provided that comprises:

a programmable via structure including at least two phase change material vias that are both directly contacting a heating element, said programmable via structure further including a first terminal in contact with a first portion of said heating element, a second terminal in contact with a second portion of said heating element, a third terminal in contact with one of said at least two programmable vias, and a fourth terminal in contact with another one of said at least two programmable vias;

a first circuit block in contact with one of said third and fourth terminals;

a second circuit block in contact with the third or fourth terminal not contacting said first circuit block;

a source region of a first field effect transistor in contact with one of said first and second terminals; and a drain region of a second field effect transistor in contact with the first or second terminal that is not contacting said source region of said first field effect transistor.

The working principal of the inventive switch unit is that a write line connects to the two gates of the transistors, which further controls the ON/OFF of these transistors. When the write line is on, then the current supplied from the bit line connected to the drain electrode of one of the transistors will decide the current/power passing through the heating element. The power from the heating element will, in turn, decide the states of the two PCM-containing vias, i.e., their ON state or their OFF state. When the PCM-containing vias are in an ON state, the communication between two circuit blocks across the vias are allowed. When the vias are in an OFF state, the signal cannot pass through between the two circuit blocks due to high resistance.

The present invention also provides a switch unit array that comprises:

a plurality of programmable via structures, each programmable via structure including at least two phase change material vias that are both directly contacting a heating element, said programmable via structure further including a first terminal in contact with a first portion of said heating element, a second terminal in contact with a second portion of said heating element, a third terminal in contact with one of said at least two programmable vias, and a fourth terminal in contact with another one of said at least two programmable vias; a first circuit block in contact with one of said third and fourth terminals; a second circuit block in contact with the third or fourth terminal not contacting said first circuit block; a source region of a first field effect transistor in contact with one of said first and second terminals; and a drain region of a second field effect transistor in contact with the first or second terminal that is not contacting said source region of said first field effect transistor.

In addition to the switch unit and switch array described above, the present invention also provides a method of operation (i.e., switching) which includes;

providing a structure including:

at least one programmable via structure including at least two phase change material vias that are both directly contacting a heating element, said at least one programmable via structure further including a first terminal in contact with a first portion of said heating element a second terminal in contact with a second portion of said heating element, a third terminal in contact with one of said at least two programmable vias, and a fourth terminal in contact with another one of said at least two programmable vias; a first circuit block in contact with one of said third and fourth terminals; a second circuit block in contact with the third or fourth terminal not contacting said first circuit block;

a source region of a first field effect transistor in contact with one of said first and second terminals, a drain region of said first field effect transistor in contact with a bit line, and a gate of said first field effect transistor is in contact with a write line; and a drain region of a second field effect transistor in contact with the first or second terminal that is not contacting said source region of said first field effect transistor, said second transistor further including a source region in contact to ground, and a gate of said second field effect transistor is in contact with said write line; and applying a current pulse through said bit line wherein said current pulse passes through said heating element and changes an initial state of the at least two phase change materials within said vias to a secondary state.

In one embodiment, the initial state is crystalline and the second state is amorphous and the current pulse melts and quenches/amorphizes a thin region of each of the phase change material vias. In another embodiment, the initial state is amorphous and the second state is crystalline and the current pulse anneals each of said phase change material vias.

DETAILED DESCRIPTION OF THE INVENTION

The present invention, which provides a switch unit and switch unit array using at least one programmable via structure with a phase change material, will now be described in greater detail by referring to the following description and drawings that accompany the present application. It is noted that the drawings of the present application are provided for illustrative purposes and, as such, they are not drawn to scale.

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced without these specific details. In other instances, well-known structures or processing steps have not been described in detail in order to avoid obscuring the invention.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

As stated above, the present invention provides a switch unit as well as an array with switch units. Each switch unit within the array is connected to control/switch certain circuit blocks. Each switch unit structure of the present invention comprises a four terminal programmable via structure. In one embodiment of the present invention, the four terminal via structure includes at least two programmable vias that are filled with phase change materials that are integrated with a heating material. In particular, one of the programmable vias is located beneath the heating material, while the other programmable via is located above the heating material. That is, each of the programmable vias is in contact with opposing surfaces of a heating material. The at least two programmable vias are substantially aligned to each other. The two programmable vias can be contacted to two different terminals, while end portions of the upper surface of the heating material can be connected to two different terminals. Thus, the inventive structure is a four terminal device which can control and switch signals from an outside power source.

Figure 1:
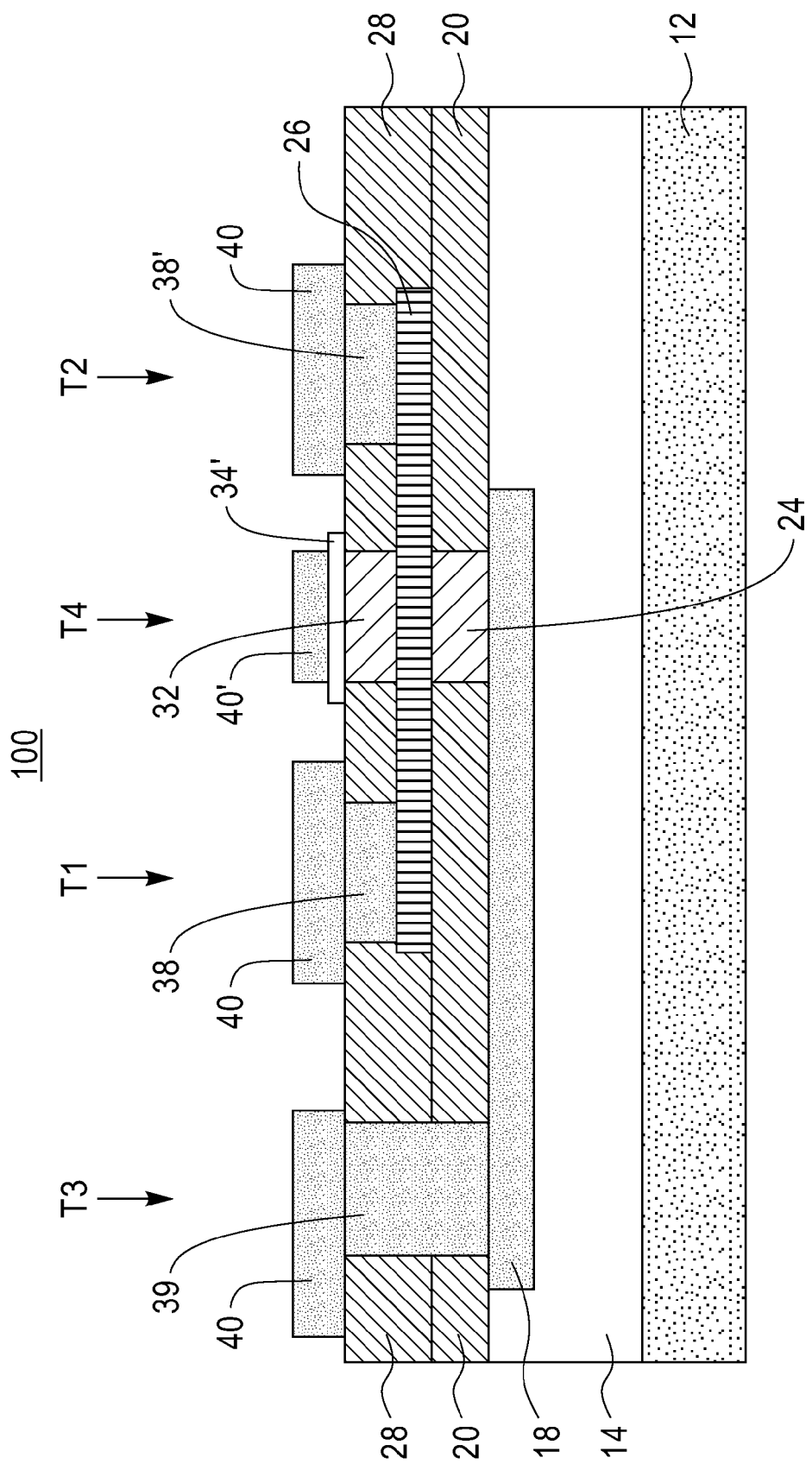
FIG. 1 is a pictorial representation (through a cross sectional view) illustrating a basic four terminal programmable via structure that can be used in the present invention.

Reference is first made to FIG. 1 which provides a pictorial illustration (through a cross sectional view) of a preferred four terminal programmable via structure that can be employed in the present invention. As shown, the four terminal programmable via structure 100 includes a semiconductor substrate 12 such as, for example, a Si-containing semiconductor substrate. A first dielectric layer 14 such as, for example, a thermal oxide, is located atop the semiconductor substrate 12. The first dielectric layer 14 includes a conductive material 18 that is embedded within the first dielectric layer 14. A second dielectric layer 20 is located atop the first dielectric layer 14 as well as exposed surfaces of the conductive material 18.

Within the second dielectric layer 20 there is present at least one first via that is filled with a first phase change material (hereinafter also referred to a first programmable via 24). As illustrated in FIG. 1, the first programmable via 24 has a surface that directly contacts an upper surface of the conductive material 18.

A patterned heating material (hereinafter heating element 26), such as, for example, TaSiN, is located atop the second dielectric layer 20 as well as exposed surfaces of the first programmable via 24. A third dielectric layer 28 which includes at least one second via that is filled with a second phase change material (hereinafter also referred to a second programmable via 32) is located atop the second dielectric layer 20 as well as the heating element 26.

As is illustrated, the second programmable via 32 contacts an upper surface of the heating element 26. As such, the inventive structure includes at least a first programmable via 24 and a second programmable via 32 that are located on opposing surfaces of the heating element 26.

A patterned diffusion barrier 34' is located on an exposed surface of the second programmable via 32.

The structure also includes first and second conductively filled contact vias 38 and 38' respectively, extending through the third dielectric layer 28 and in contact with an upper surface of the heating element 26. As is illustrated, the first and second conductively filled contact vias are located at end portions of the heating element 26. A third conductively filled contact via 39 extends through the third dielectric layer 28 and the second dielectric layer 20 to an upper surface of the conductive material 18 which is embedded within the first dielectric layer 14. The conductive material 18 forms a $M_n$ (metal level n, wherein n is an integer starting from 1) and conductively filled vias 38, 38' and 39 form a $M_{n+1}$ (metal level n+1) in the structure.

As is also shown in FIG. 1, each of the conductively filled vias (38, 38' and 39) is capped with a conductive material 40. It is emphasized that the conductive material 40 is also present within the conductively filled vias 38, 38' and 39. A conductive material 40' (which is the same material as that of conductive material 40) is also located atop the patterned diffusion barrier 34' that is present on the second programmable via 32. In FIG. 1, T1 stands for a first terminal, T2 stands for a second terminal, T3 stands for a third terminal and T4 stands for a fourth terminal. T3 and T4 are in contact with the two programmable vias 24 and 32, respectively, T1 and T2 are connected to end portions of the heating element 26.

It is noted that the four terminal programmable via structure illustrated in FIG. 1 is a preferred four terminal via structure that is employed in the present. Although this preferred structure is described and illustrated in detail, other four terminal via structures including a heating element and at least two programmable vias that are in direct contact with the heating element can be used.

The four terminal programmable via structures used in the present invention can be fabricated utilizing conventional techniques well known to those skilled in the art. Typically, various deposition, lithography and etching steps are used to fabricate such four terminal programmable via structures. The four terminal programmable via structure illustrated in FIG. 1 is formed utilizing the processing steps that are described in detail in co-pending and co-assigned U.S. application Ser. No. 11/733,523, filed Apr. 10, 2007. The entire contents of the '523 application are incorporated herein by reference.

The materials present in the four terminal programmable via structures are also well known to those skilled in the art. The following is a description of the materials labeled and shown in FIG. 1. The semiconductor substrate 12 comprises any material having semiconductor properties including, for example, Si, SiGe, SiGeC, SiC, Ge alloys, GaAs, InAs, InP as well other III-V or II-VI compound semiconductors. The semiconductor substrate 12 may also comprise a layered semiconductor such as, for example, Si/SiGe, a silicon-on-insulator (SOI) or a SiGe-on-insulator (SGOI). Preferably, the semiconductor substrate 12 is composed of a Si-containing semiconductor material, i.e., a semiconductor material that includes silicon. The semiconductor substrate 12 may comprise a single crystal orientation or it may be a hybrid semiconductor substrate having surface regions of different crystal orientation. The semiconductor substrate 12 may include a strained semiconductor material, an unstrained semiconductor or a combination of strained and unstrained semiconductor materials are also within the scope of the instant invention. The semiconductor substrate 12 may be doped, undoped or contain doped and undoped regions (not specifically shown) therein.

The first dielectric layer 14 comprises any material having insulating properties including, for example, an oxide, a nitride, an oxynitride, a spun-on glass or multilayers thereof. Preferably, the first dielectric layer 14 is an oxide such as, for example, an oxide of silicon, with a thermal oxide of silicon being most preferred.

The conductive material 18 comprises any conductive material including, for example, a metal, a metal alloy, a metal silicide and multilayers thereof. Preferably, the conductive material 18 is a conductive metal including one of Al, W and Cu. In one embodiment, W is employed as the conductive material 18. It is noted that the conductive material 18 forms a wiring region ($M_n$) within the structure for contacting the first (i.e., lower) programmable via to an outside connection.

The second dielectric layer 20 may comprise the same or different material as the first dielectric layer 14. Typically, the second dielectric layer 20 is an oxide such as, for example, an oxide of silicon.

The first programmable via 24 includes a first phase change material (PCM) that has electrical properties (e.g., resistance, capacitance, etc.) that may be changed through the application of energy such as, for example, heat, light, voltage potential, or electrical current. Examples of a PCM include a chalcogenide material or a chalcogenide alloy. A chalcogenide material is a material that includes at least one element from Group VIB (IUPAC nomenclature) of the Periodic Table of Elements, i.e., any of the elements of tellurium, sulfur, or selenium. The chalcogenide may be a pure material or it can be doped with N and/or Si. In a preferred embodiment of the present invention, the first PCM within the first programmable via 24 is comprised of $Ge_2Sb_2Te_5$ or GeSb.

The heating material 26 comprises any material (typically an oxide and/or nitride) whose resistivity is higher than the resistivity of the metal wiring to be subsequently formed. Typically, the heating material 26 employed in the present invention has a resistivity from about 100 to about 10000 ohm cm with a resistivity from about 500 to about 3000 ohm cm being even more typical. In one preferred embodiment of the present invention, the heating material 26 is a silicided nitride such as, for example, TaSiN, having a resistivity of about 2000 ohm cm. In another embodiment, the heating material 26 is an oxide such as, for example, $CrO_2$ or $RuO_2$. In a highly preferred embodiment of the present invention, $Ta_xSi_yN_z$ (where x, y and z are from 0 to approximately 1) is used as the heating material 26.

The third dielectric layer 28 may comprise the same or different dielectric material as the second dielectric layer 20. Typically, the second and third dielectric layers (20 and 28, respectively) are comprised of an oxide of silicon.

The second programmable via 32 includes a second PCM that may comprise the same or different, preferably, the same, material as that of the first PCM within first programmable via 24. In a preferred embodiment of the present invention, the second PCM with the second programmable via 32 is comprised of $Ge_2Sb_2Te_5$ or GeSb.

The diffusion barrier 34' comprises any material which prevents diffusion of contaminates into the PCM filled via. The diffusion barrier 34' comprises at least one of Ta, TaN, T1, TiN, Ru, ZrN and RuN. Typically, a stack of TiN/Ti or TaN/Ta is employed as the diffusion barrier layer 34.

The conductive material 18, 40 and 40' which forms the conductive wiring of the inventive structure comprises an elemental metal such as for example, W, Cu, Al or alloys thereof such AlCu. Preferably, W is used as the conductive material.

As mentioned above, the programmable via structure shown in FIG. 1 represents one type of four terminal programmable via structure that can be used in the present invention. Other types of programmable via structures including at least two programmable vias in direct contact with a heating element, and four terminals are also contemplated in the present invention.

Common to each of the four terminal structures that can be employed is that each contains at least two vias that are filled with a phase change material. The at least two vias are in direct contact with a heating element. The phase change material in the vias can be switched, as described above, between resistive (OFF-amorphous) and conductive (ON-crystalline) states with an integrated external heating element. The switching process is achieved in the present invention by a current pulse passed through the heating element that abuts the phase change via. The OFF switching operation is accomplished by an abrupt high-current pulse (on the order of greater than 1 mAmps) which melts and quenches/amorphizes a thin region of each of the phase change material vias. In the ON switching operation, a relatively low current (on the order of less than 1 mAmps), but a longer, pulse is applied through the heating element to anneal the amorphous phase change material(s) to the crystalline state.

Figure 2:
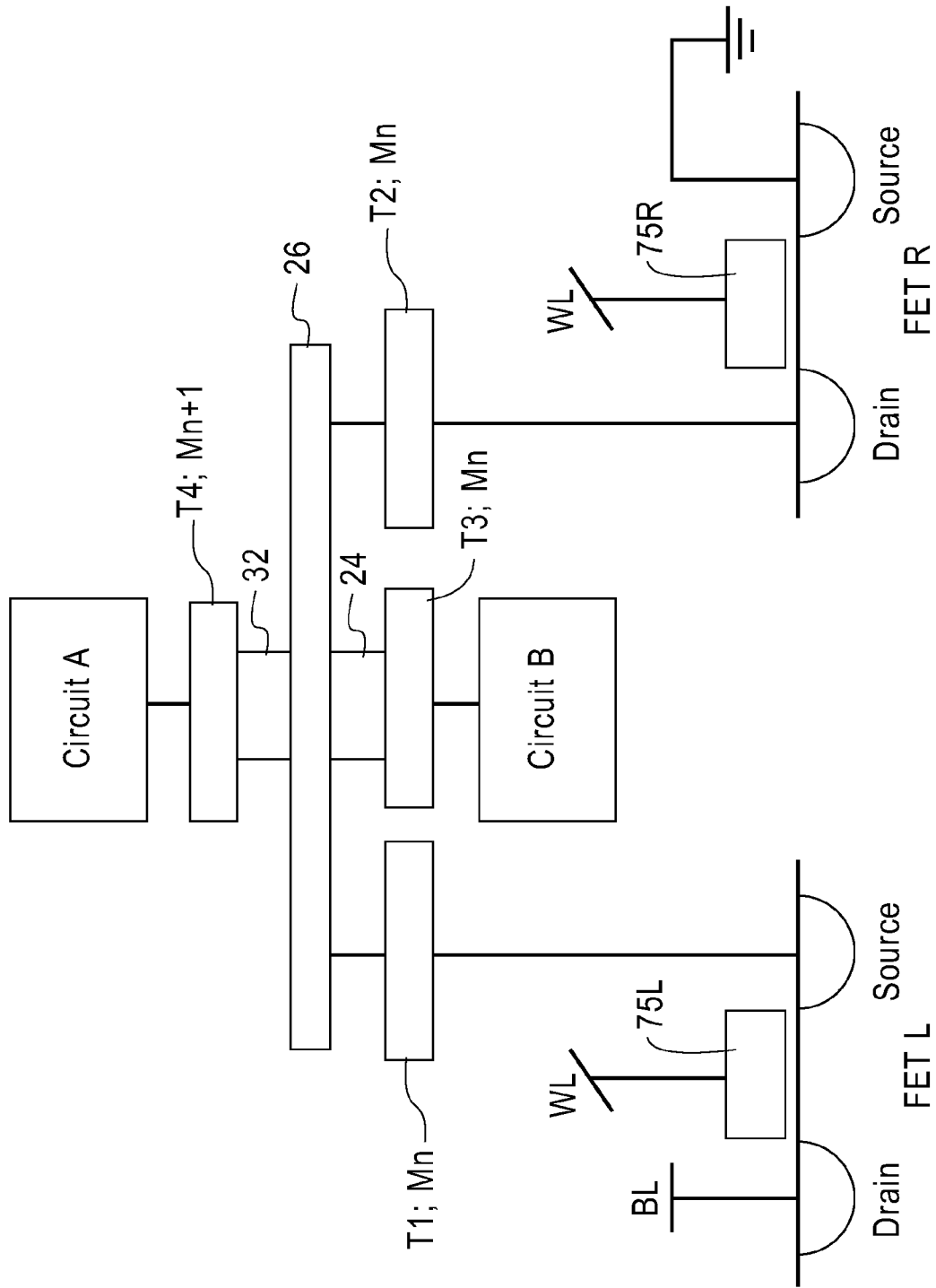
FIG. 2 is a schematic diagram illustrating a one switch unit structure design, which includes a four terminal programmable via structure such as shown in FIG. 1 and two field effect transistors (FET R and FET L).

FIG. 2 is a schematic diagram illustrating a typical one switch unit structure design of the present invention, which includes a four terminal programmable via structure such as shown in FIG. 1 and two field effect transistors (FET R and FET L). In the inventive one switch unit design, Terminal 4, T4, is connected to the second programmable via 32 though metal level $M_{n+1}$ and also connects to circuit block A on the other side. Terminal 3, T3, connects to the first programmable via 24 through metal level Mn and also connects to circuit block B on the other side. Terminal 1, T1, connects to left hand side of the heating element 26 through a metal level Mn and also connects to a source region of FET L (FET L's drain region connects to a bit line, BL). Terminal 2, T2, connects to the right hand side of the heating element 26 through metal level Mn and also connects to a drain region of FET R (the source region is grounded).

Circuit blocks A and B include any conventional circuit that is capable of any logic and memory function. Examples of such circuits include, but are not limited to a signal computing unit and a data storage unit.

The gates (75L and 75R) of both FET L and FET R are connected to a write line (defined as WL). The source region or the drain region of FET L, which is not connected to heating element 26, is connected to a bit-line (defined as BL). The source or drain region FET R which is not connected to the heating element is always grounded.

In order to switch ON/OFF, the communications between circuit block A and B, the resistances states of the PCM vias above and below (32 and 24, respectively) the heating element 26 have to be controlled between crystalline and amorphous by changing the current passing through the heating element 26.

Assuming the initial state of the PCM vias is ON (crystalline states), in order to switch them to OFF to block circuit A or B, one has to turn on both FET L and FET R by applying enough current on the gates through WL. At the same time, an abrupt high-current pulse is sent through BL into FET L and pass through the heating element 24 to melt and quench/amorphize a thin region of phase-change via adjacent to it. Therefore the resistance states of PCM vias will become OFF and achieve the OFF process.

To turn PCM vias back to ON, one has to turn on both FET L and FET R by applying enough current on the gates through WL. A relatively low current, but longer, pulse is then applied from BL to FET L and passes through the heating element 24 to anneal the amorphous phase change materials to the crystalline state. Therefore the resistance states of PCM vias will become ON and two circuits blocks can commute each other.

When not using the switch unit, one can simply turns two FET L and FET R off thus no current can pass through the heating element 24.

Figure 3:
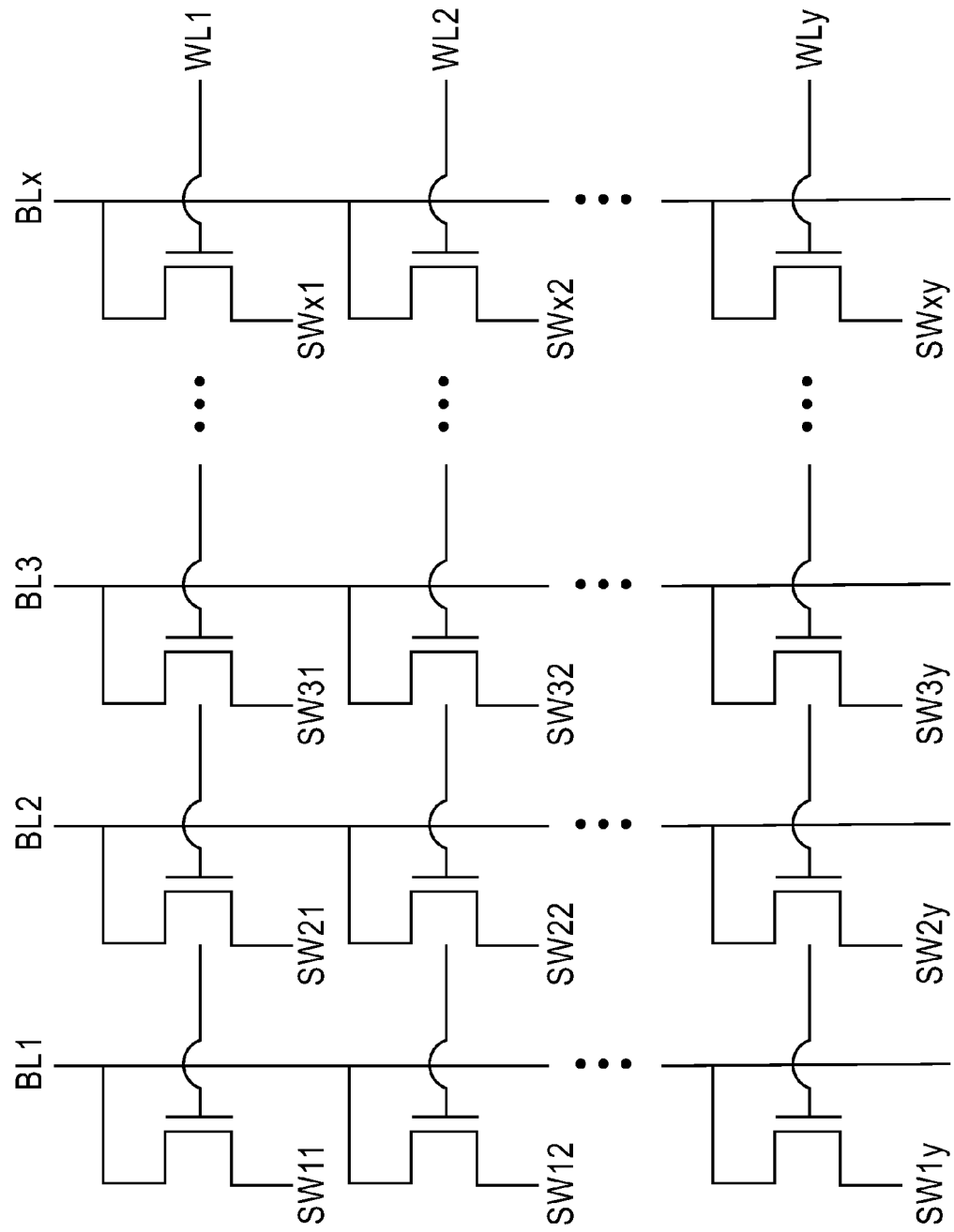
FIG. 3 is a schematic diagram of the inventive circuit system design FET L network which connects to the left hand side of a heating element of a single switch unit such as shown in FIG. 2.
Figure 4:
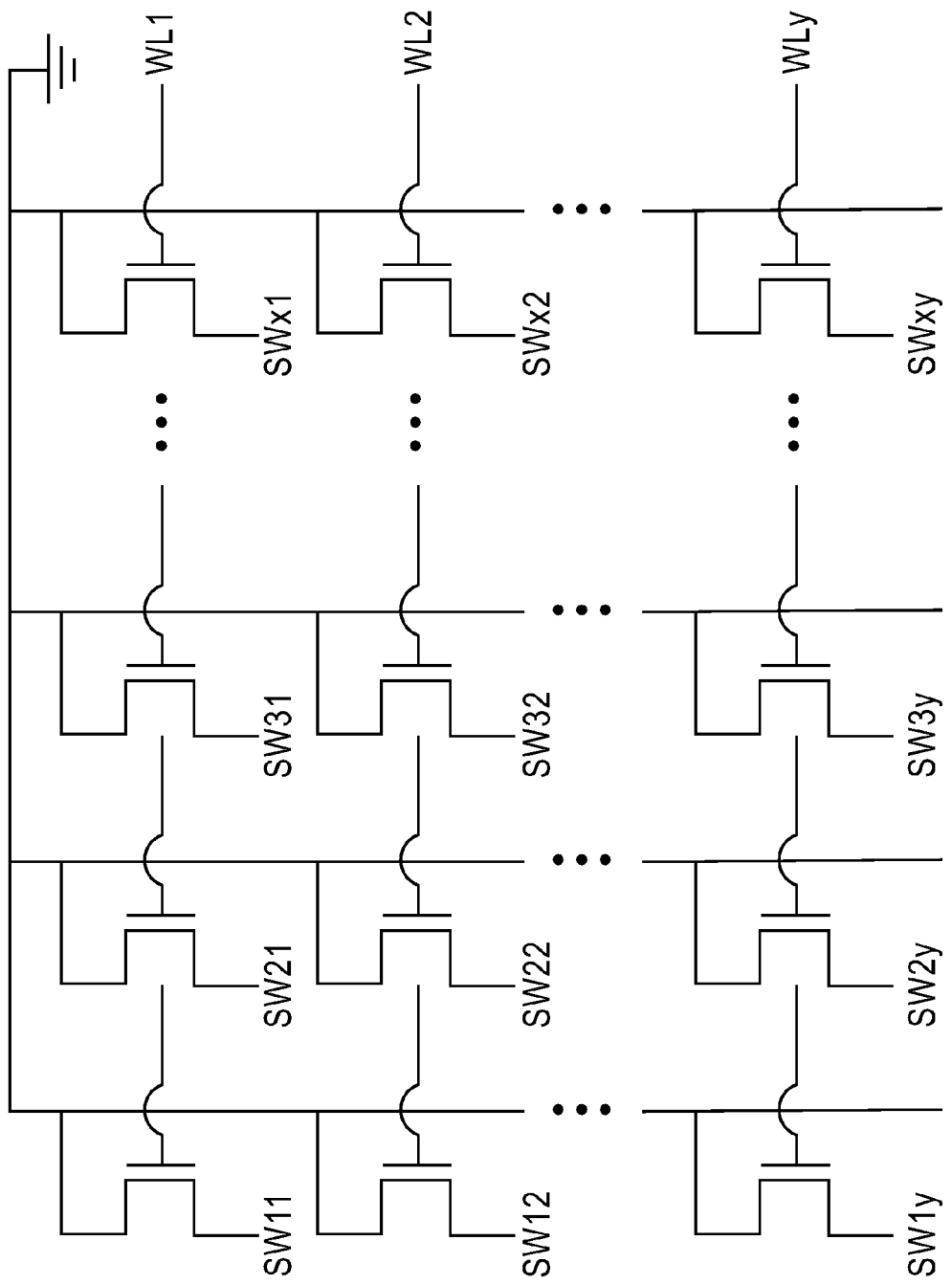
FIG. 4 is a schematic diagram of the inventive circuit system design FET R network which connects to the right hand side of a heating element of a single switch unit such as shown in FIG. 2.

Reference is now made to FIGS. 3-4 which show a basic switch array of the present invention. The inventive switch array concept is comprised of 2 two-dimensional networks of FETs connecting to switch units using the previous concept illustrated above. FIG. 3 shows the FET L network which connects to the left hand side of the heating element 24 of a single switch unit (defined as SWxy). Terminals of each single FET L unit connect to BLx, WLy and SWxy, respectively. FIG. 4 shows the FET R network which connects to the right hand side of the heating element 24 of a single switch unit (defined as SWxy). Terminals of each single FET R unit connect to WLy, SWxy, and grounds respectively.

One wants to turn SWxy OFF, WLy is to supply enough current to turn on the gates (75L and 75R) of FET L and FET R connecting to SWxy. Next, BLx supplies a short high current pulse into SWxy heating element and makes the two PCM vias become amorphous. To turn SWxy back to ON the same operation is performed but the current pulse into heating element is lower and longer. All other BL and WL units can be kept off since no required function is needed at this point.

Therefore, it can be seen using this switch array concept can effectively manage the circuit system and control individual area function through the fast reconfigurable (programmable) function.

While the invention has been described herein with reference to specific embodiments, features and aspects, it will be recognized that the invention is not thus limited, but rather extends in utility to other modifications, variations, applications, and embodiments, and accordingly all such other modifications, variations, applications, and embodiments are to be regarded as being within the spirit and scope of the invention.

What is claimed is:

1. A switch unit comprising:
a programmable via structure including at least a first phase change material via directly contacting a bottom surface of a heating element and a second phase change material via directly contacting an upper surface of said heating element, said programmable via structure further including a first terminal in contact with a first portion of said heating element, a second terminal in contact with a second portion of said heating element, a third terminal in contact with said first phase change material via, and a fourth terminal in contact with said second phase change material via;
a first circuit block in contact with one of said third and fourth terminals;
a second circuit block in contact with the third or fourth terminal not contacting said first circuit block;
a source region of a first field effect transistor in contact with one of said first and second terminals; and
a drain region of a second field effect transistor in contact with the first or second terminal that is not contacting said source region of said first field effect transistor.

2. The switch unit of claim 1 further comprising a first dielectric layer located on a surface of a semiconductor substrate, said first dielectric layer having a conductive material embedded therein; a second dielectric layer located atop the first dielectric layer and said conductive material, said second dielectric layer including said first phase change material via, said first phase change material via having a surface directly contacting an upper surface of the conductive material, said heating element is located on an upper surface of the second dielectric layer and directly atop said first phase change material via; a third dielectric layer having the second phase change material via located on said heating element and exposed surfaces of said second dielectric layer; and a patterned diffusion barrier located on an exposed surface of said second phase change material via.

3. The switch unit of claim 1 wherein each of said phase change material vias includes a chalcogenide material or a chalcogenide alloy.

4. The switch unit of claim 3 wherein said chalcogenide material or chalcogenide alloy is one of $Ge_2Sb_2Te_5$ and GeSb.

5. The switch unit of claim 1 wherein said heating element is a nitride or an oxide having a resistivity of about 100 ohm cm or greater.

6. The switch unit of claim 5 wherein said heating element is $Ta_xSi_yN_z$ where x, y and z are approximately from 0 to 1, $CrO_2$ or $RuO_2$.

7. The switch unit of claim 1 wherein said first field effect transistor further includes a drain region in contact with a bit line, and a gate of said first field effect transistor is in contact with a write line.

8. The switch unit of claim 1 wherein said second field effect transistor further includes a source region in contact to ground, and a gate of said second field effect transistor is in contact with a write line.

9. The single switch unit of claim 1 wherein said first field effect transistor further includes a drain region in contact with a bit line, and a gate of said first field effect transistor is in contact a write line, and said second field effect transistor further includes a source region in contact to ground, and a gate of said second field effect transistor is in contact with said write line.

10. A switch unit array comprising:
a plurality of programmable via structures, each programmable via structure including a first phase change material via directly contacting a bottom surface of a heating element and a second phase change material via directly contacting an upper surface of said heating element, said programmable via structure further including a first terminal in contact with a first portion of said heating element, a second terminal in contact with a second portion of said heating element, a third terminal in contact with said first phase change material via, and a fourth terminal in contact with said second phase change material via; a first circuit block in contact with one of said third and fourth terminals; a second circuit block in contact with the third or fourth terminal not contacting said first circuit block; a source region of a first field effect transistor in contact with one of said first and second terminals; and a drain region of a second field effect transistor in contact with the first or second terminal that is not contacting said source region of said first field effect transistor.

11. The switch unit array of claim 10 wherein each programmable via structure further comprising a first dielectric layer located on a surface of a semiconductor substrate, said first dielectric layer having a conductive material embedded therein; a second dielectric layer located atop the first dielectric layer and said conductive material, said second dielectric layer including said first phase change material via, said first phase change material via having a surface directly contacting an upper surface of the conductive material, said heating element is located on an upper surface of the second dielectric layer and directly atop said second phase change material via; a third dielectric layer having the second phase change material via located on said heating element and exposed surfaces of said second dielectric layer; and a patterned diffusion barrier located on an exposed surface of said second phase change material via.

12. The switch unit array of claim 10 wherein each of said phase change material vias includes a chalcogenide material or a chalcogenide alloy.

13. The switch unit array of claim 10 wherein each heating element is a nitride or an oxide having a resistivity of about 100 ohm cm or greater.

14. The switch unit array of claim 13 wherein each heating element is $Ta_xSi_yN_z$ where x, y and z are approximately from 0 to 1, $CrO_2$ or $RuO_2$.

15. The switch unit array of claim 10 wherein each of said first field effect transistors further includes a drain region in contact with a bit line, and a gate of each of said first field effect transistor is in contact with a write line.

16. The switch unit array of claim 10 wherein each of said second field effect transistors further includes a source region in contact to ground, and a gate of each of said second field effect transistors is in contact with a write line.

17. The single switch unit array of claim 10 wherein each of said first field effect transistors further includes a drain region in contact with a bit line, and each gate of said first field effect transistors is in contact with a write line, and each second field effect transistor further includes a source region in contact to ground, and each gate of said second field effect transistor is in contact with said write line.

* * * * *